US012527094B2

(12) United States Patent
Meuris

(10) Patent No.: US 12,527,094 B2
(45) Date of Patent: Jan. 13, 2026

(54) BYPASS DIODE ASSEMBLY FOR A PHOTOVOLTAIC MODULE AND METHOD FOR FABRICATING

(71) Applicants: IMEC VZW, Leuven (BE); Universiteit Hasselt, Hasselt (BE)

(72) Inventor: Marc Meuris, Keerbergen (BE)

(73) Assignees: IMEC VZW, Leuven (BE); Universiteit Hasselt, Hasselt (BE)

( * ) Notice: Subject to any disclaimer, the term of this patent is extended or adjusted under 35 U.S.C. 154(b) by 0 days.

(21) Appl. No.: 18/980,575

(22) Filed: Dec. 13, 2024

(65) Prior Publication Data

US 2025/0204055 A1    Jun. 19, 2025

(30) Foreign Application Priority Data

Dec. 19, 2023 (EP) .................................... 23217962

(51) Int. Cl.
*H10F 19/70* (2025.01)
*H10D 8/60* (2025.01)
(Continued)

(52) U.S. Cl.
CPC ............. *H10F 19/70* (2025.01); *H10D 8/60* (2025.01); *H10D 80/231* (2025.01); *H10F 19/902* (2025.01)

(58) Field of Classification Search
CPC ......... H10F 19/70; H10F 19/902; H10D 8/60; H10D 80/231
See application file for complete search history.

(56) References Cited

U.S. PATENT DOCUMENTS 8,586,857 B2   11/2013   Everson et al.
9,059,351 B2    6/2015   Croft et al.
(Continued)

FOREIGN PATENT DOCUMENTS

CN    204289477 U    4/2015
CN    106847962 A    6/2017
(Continued)

OTHER PUBLICATIONS

Extended European Search Report for European Patent Application 23217962.2-1002, dated May 22, 2024.

*Primary Examiner* — Mayla Gonzalez Ramos
(74) *Attorney, Agent, or Firm* — MCDONNELL BOEHNEN HULBERT & BERGHOFF LLP

(57) ABSTRACT

A bypass diode assembly and a method for fabricating the bypass diode assembly are provided, the bypass diode assembly comprising an electrically insulating tape, an electrically conductive ribbon extending over the back side of the tape and locally exposed at the front side of the tape through an opening, a semiconductor component positioned in a hole through the tape, wherein the semiconductor component comprises a diode electrically connected between a first contact pad of the semiconductor component in electrical contact with the electrically conductive ribbon and a second contact pad of the semiconductor component, and an electrically conductive ribbon portion on the front side of the tape in electrical contact with the second contact pad of the semiconductor component. The electrically conductive ribbon portion is electrically isolated from the first electrically conductive ribbon by the electrically insulating tape. A photovoltaic module comprising at least one bypass diode assembly is provided.

20 Claims, 7 Drawing Sheets

(51) Int. Cl.
  *H10D 80/20* (2025.01)
  *H10F 19/90* (2025.01)

(56) References Cited

U.S. PATENT DOCUMENTS

| | | | | |
|---|---|---|---|---|
| 2010/0108122 | A1* | 5/2010 | Everson | H02S 40/34 |
| | | | | 136/246 |
| 2010/0147364 | A1* | 6/2010 | Gonzalez | H10F 19/70 |
| | | | | 136/251 |
| 2014/0124014 | A1 | 5/2014 | Morad et al. | |
| 2016/0099363 | A1* | 4/2016 | Whetsel | B64U 50/31 |
| | | | | 136/246 |

FOREIGN PATENT DOCUMENTS

| | | |
|---|---|---|
| CN | 207651497 U | 7/2018 |
| WO | 2010057216 A3 | 5/2010 |

\* cited by examiner though the electrically insulating tape and the semiconductor component comprising the diode is at the other hand in electrical contact with the electrically conductive ribbon portion extending on the front side of the electrically insulating tape.

BYPASS DIODE ASSEMBLY FOR A PHOTOVOLTAIC MODULE AND METHOD FOR FABRICATING

CROSS-REFERENCE TO RELATED APPLICATIONS

The present application is a non-provisional patent application claiming priority to European Patent Application No. 23217962.2, filed Dec. 19, 2023, the contents of which are hereby incorporated by reference.

FIELD OF THE DISCLOSURE

The present disclosure relates to a bypass diode assembly for a photovoltaic module, to a photovoltaic module comprising at least one such bypass diode assembly and to a method for fabricating a bypass diode assembly.

BACKGROUND

A photovoltaic cell string refers to a plurality of photovoltaic cells connected in series. A photovoltaic module comprises at least one cell string, wherein the cell strings are electrically interconnected in series or in parallel. Electrically connecting bypass diodes in parallel to a photovoltaic cell or a group of photovoltaic cells facilitate avoiding a large reverse voltage bias over a cell in case of current mismatch, for example when a cell is shadowed, while other cells series-connected therewith are irradiated by sunlight. For certain types of thin-film photovoltaic modules, such as $Cu(In,Ga)Se_2$ (CIGS) based photovoltaic modules, it is recommended to place a bypass diode per two to four series-connected cells, which may be across every group of two cells.

Methods for integrating bypass diodes in a photovoltaic module include the fabrication of Printed Circuit Board (PCB) strips with the bypass diode incorporated therein. The PCB strip has two contacts that can be electrically connected to the back side of respective photovoltaic cells of a string of series-connected cells, for example across every group of two or more cells. This is however a relatively expensive solution, using for example packaging of the bypass diode and mounting it to a Printed Circuit Board.

U.S. Pat. No. 9,059,351 discloses a bypass diode assembly including an insulating strip, at least one diode-lead assembly having a diode and two leads, and at least two interconnecting conductors overlapping with and electrically contacting the leads of the lead-diode assembly. The insulating strip supports the lead-diode assembly and conductors and at least partially insulates these components from photovoltaic cells. When integrated in a photovoltaic module, the interconnecting conductors are electrically connected to the back sides of the cells through cutouts in the insulating strip. Also this approach is relatively costly, as it uses the fabrication or purchase of specifically dimensioned lead-diode assemblies. Furthermore, such bypass diode assemblies may be challenging to handle by pick-and-place equipment and use good alignment when integrating them in a photovoltaic module. Therefore, handling and integration of these bypass diode assemblies in a highly automated way with high throughput may be result in non-cost-effective fabrication methods.

Thus, it may be useful to provide an improved, cost-effective bypass diode assembly that can be fabricated in an automated way with high throughput and that can further-more be integrated in a photovoltaic module in a cost-effective, automated way with high throughput.

SUMMARY

It is an objective of the present disclosure to provide a cost-effective bypass diode assembly that can be fabricated in an automated way with high throughput and at a reduced cost as compared to known solutions.

Another objective is to provide a bypass diode assembly that can be integrated in a photovoltaic module in an automated and cost-effective way.

These and other objectives are at least partly met by the disclosure as disclosed in the independent claims. Example embodiments are set out in the dependent claims.

According to a first aspect there is provided a bypass diode assembly for a photovoltaic module, the bypass diode assembly comprising: an electrically insulating tape extending in a longitudinal direction, the electrically insulating tape having a front side and a back side; a first electrically conductive ribbon attached to the electrically insulating tape and oriented parallel to the longitudinal direction, wherein the first electrically conductive ribbon extends over the back side of the electrically insulating tape at least between a first location and a second location spaced apart over a predetermined distance in the longitudinal direction and at least partially overlaps the first location and the second location, and wherein the first electrically conductive ribbon is locally exposed at the front side through an opening in the electrically insulation tape at the first location. The bypass diode assembly comprises a semiconductor component positioned in a through hole through the electrically insulating tape at the second location, the semiconductor component comprising a diode having a first diode terminal and a second diode terminal, a first contact pad in electrical contact with the first electrically conductive ribbon and electrically connected to the first diode terminal, and a second contact pad electrically connected to the second diode terminal. The bypass diode assembly further comprises an electrically conductive ribbon portion on the front side of the electrically insulating tape and overlapping the semiconductor component, wherein the electrically conductive ribbon portion is in electrical contact with the second contact pad of the semiconductor component and wherein the electrically conductive ribbon portion is electrically isolated from the first electrically conductive ribbon by the electrically insulating tape.

The first electrically conductive ribbon being locally exposed at the front side of the electrically insulating tape is useful in that the exposed portion provides a first contact area at the front side of the electrically insulating tape, for example for electrical connection to a first photovoltaic cell of a cell string.

The electrically conductive ribbon portion provides a second contact area at the front side of the electrically conductive tape, for example for electrical connection to a second photovoltaic cell connected in series with the first photovoltaic cell. This is useful in that it allows easy electrical connection of the bypass diode assembly and thus the diode in parallel with the series-connected photovoltaic cells, such that the diode can function as a bypass diode.

The semiconductor component comprising the diode is positioned in a hole through the electrically insulating tape at the second location, with at one hand a first contact pad electrically connected to the first diode terminal and in electrical contact with the first electrically conductive ribbon located at the back side of the electrically insulating tape, and at the other hand a second contact pad electrically connected to the second diode terminal and in electrical contact with the electrically conductive ribbon portion at the front side of the electrically insulating tape. According to an example embodiment the first contact pad and the second contact pad of the semiconductor component are located at opposite surfaces of the semiconductor component. According to an example embodiment the semiconductor component is a bare die Schottky diode component. This is useful in that a standard, commercially available diode having a first diode terminal at a first surface and a second diode terminal at a second surface opposite to the first surface can readily be used. This is useful to avoid first performing a PCB process, resulting in a cost-effective solution.

According to an example embodiment, the first electrically conductive ribbon and/or the electrically conductive ribbon portion are attached to the electrically insulating tape with of an adhesive. According to an example embodiment, the electrically insulating tape is covered by or coated by an adhesive layer at both opposite surfaces. As an example, the electrically conductive tape comprises an electrically insulating polymer layer for example a polyolefin layer, a polyethylene terephthalate (PET) layer, a silicone layer or a Poly(Methyl MethAcrylate) (PMMA) layer sandwiched between two outer adhesive layers.

According to an example embodiment the electrically insulating tape 1 is an optically non-transparent tape or a colored tape, for example for aesthetical reasons.

According to an example embodiment, a thickness of the electrically insulating tape is in the range between 0.2 mm and 0.4 mm. According to an example embodiment, a thickness of the first electrically conductive ribbon and/or a thickness of the electrically conductive ribbon portion is in the range between 0.05 mm and 0.15 mm.

According to an example embodiment, the first contact pad is electrically connected to the first electrically conductive ribbon by a welded or soldered connection and the second contact pad is electrically connected to the electrically conductive ribbon portion by a welded or soldered connection.

According to an example embodiment, the first electrically conductive ribbon fully overlaps the first location and is locally exposed at the front side of the electrically insulating foil over substantially the entire surface area of the opening. This is useful in that a size of the first contact area provided by the exposed portion of the first electrically conductive ribbon can be sufficiently large to enable easy and reliable electrical connection, for example to a first photovoltaic cell.

According to an example embodiment, at the location of the opening at least one portion of the electrically insulating tape covers a back side of the first electrically conductive ribbon. This is useful in that the at least one portion can mechanically support the first electrically conductive ribbon at the back side thereof at the location of the opening and push the first electrically conductive ribbon towards the front side of the electrically insulating tape. This is useful in that the first contact area can thereby be provided substantially in the plane of the front surface, front side, of the electrically insulating tape.

It is a characteristic of bypass diode assemblies of the disclosure that they can easily be handled by pick-and-place equipment, for example when placing a bypass diode on a photovoltaic module for integration therewith, e.g. in a high-throughput photovoltaic module manufacturing line. In this way a reliable and cost-effective fabrication process can be obtained.

The predetermined distance a between the first location 30 and the second location 31 is selected based on the number of photovoltaic cells to be bridged by the bypass diode assembly 25, and the dimensions of and the distance between the photovoltaic cells to which the bypass diode assembly 25 is to be electrically connected.

According to a second aspect, there is provided a photovoltaic module comprising a plurality of photovoltaic cells electrically connected in series and further comprising at least one bypass diode assembly according to the first aspect, wherein the diode of the at least one bypass diode assembly is electrically connected in parallel to one or more of the series-coupled photovoltaic cells.

In general, features of this aspect of the present disclosure provide similar advantages as described above in relation to the previous aspect of the disclosure.

According to an example embodiment, in a photovoltaic module of the second aspect the first contact area of the bypass diode assembly provided by the exposed portion of the first electrically conductive ribbon is electrically connected to a first photovoltaic cell of a cell string and the second contact area of the bypass diode assembly provided by the electrically conductive ribbon portion is electrically connected to a second photovoltaic cell of the cell string.

According to a third aspect, there is provided a method for fabricating a bypass diode assembly according the first aspect, the method comprising the steps of: providing an electrically insulating tape extending in a longitudinal direction and having a front side and a back side; making an opening in the electrically insulating tape at at least one first location of the electrically insulating tape; making a through hole through the electrically insulating tape at at least one second location spaced apart over a predetermined distance a from the at least one first location along the longitudinal direction; afterwards forming a tape arrangement by providing a first electrically conductive ribbon oriented parallel to the longitudinal direction of the electrically insulating tape, on the back side thereof, the first electrically conductive ribbon extending at least between at a first location and a second location and at least partially overlapping the first location and the second location, the first electrically conductive ribbon being locally exposed at the front side through the opening at the first location; placing the tape arrangement on a support surface, with the front side of the electrically insulating tape facing away from the support surface, so that an open cavity is created at the location of a through hole, wherein at least part of a bottom of the open cavity is formed by the first electrically conductive ribbon; positioning a semiconductor component in the through hole, the semiconductor component comprising a diode having a first diode terminal and a second diode terminal, a first contact pad electrically connected to the first diode terminal and a second contact pad electrically connected to the second diode terminal, wherein the first diode contact pad is provided in physical contact with the first electrically conductive ribbon at the bottom of the open cavity; placing an electrically conductive ribbon portion on the front side of the electrically insulating tape, wherein the electrically conductive ribbon portion overlaps the semiconductor component, wherein the electrically conductive ribbon portion is in physical contact with the second contact pad and is electrically isolated from the first electrically conductive ribbon by the electrically insulating tape; forming an electrical connection between the first contact pad and the first electrically conductive ribbon and forming an electrical connection between the second contact pad and the electrically conductive ribbon portion. Forming these electrical connections can for example be done by soldering or by welding.

In general, features of this aspect of the present disclosure provide similar advantages as described above in relation to the previous aspects of the disclosure.

According to an example embodiment, the first electrically conductive ribbon and/or the electrically conductive ribbon portion are attached to the electrically insulating tape by an adhesive before forming the electrical connections. This is useful in that undesired shifting of the first electrically insulated ribbon and/or of the electrically conductive ribbon portion are substantially avoided, and good, reliable electrical connections can be formed. According to an example embodiment, the electrically insulating tape is covered by an adhesive layer at both opposite surfaces. As an example, the electrically conductive tape comprises an electrically insulating polymer layer sandwiched between two outer adhesive layers. This is useful in that attaching the first electrically conductive ribbon and the electrically conductive ribbon portion to the electrically insulating tape by an adhesive force can be realized by heating the electrically insulating tape, after having provided the first electrically conductive ribbon on the back side of the electrically insulating tape and after having placed the electrically conductive ribbon on the front side of the electrically insulating tape, up to a temperature at which the outer adhesive layers become sticky.

According to an example embodiment, making the opening comprises making incisions in the electrically insulating tape, the incisions comprising a first cut oriented in a first direction and two further cuts at ends of the first cut and oriented in a second direction different from the first direction, so that the opening can be created by folding away at least one portion of the electrically insulating tape, wherein the method further comprises, after providing the first electrically conductive ribbon on the back side of the electrically insulating tape, folding back the at least one portion onto a back side of the first electrically conductive ribbon. This is useful in that, at the location of the opening, the at least one folded-back tape portion covers and mechanically supports the first electrically conductive ribbon from its back side, such that the electrically conductive ribbon can be kept well at the desired location, thereby avoiding undesired displacement of the first electrically conductive ribbon during further fabrication steps. This is useful in that the at least one folded-back tape portion pushes the first electrically conductive ribbon towards the front side of the electrically insulating tape, thereby providing the first contact area substantially in the plane of the front surface, front side, of the electrically insulating tape.

According to an example embodiment, the first cut is oriented substantially in the longitudinal direction of the electrically insulating tape and the two further cuts at ends of the first cut are oriented in a direction substantially perpendicular thereto.

According to an example embodiment, making an opening in the electrically insulating tape comprises making an opening at a plurality of first locations along the longitudinal direction of the electrically insulating tape, thereby obtaining a plurality of openings; making a through hole through the electrically insulating tape comprises making a through hole at a plurality of second locations spaced apart over a predetermined distance a from the at least one first location along the longitudinal direction, thereby obtaining a plurality of through holes, wherein second locations are alternating with first locations in the longitudinal direction; and providing the first electrically conductive ribbon comprises providing a single electrically conductive ribbon extending over each of the plurality of first locations and each of the plurality of second locations, wherein the method further comprises cutting the first electrically conductive ribbon and optionally cutting the electrically insulating tape between each of the plurality of first locations and one neighboring second location, to thereby obtain a plurality of bypass diode assemblies.

In such example embodiments, either (i) only the first electrically conductive ribbon is cut, resulting in a plurality of bypass diode assemblies attached to a single first electrically insulating tape, the individual bypass diode assemblies being electrically separated, electrically disconnected, from each other but mechanically connected to each other by the electrically insulating tape, or (ii) both the first electrically conductive ribbon and the electrically insulating tape are cut, resulting in a plurality of (e.g., completely) separated, electrically and mechanically separated, individual bypass diode assemblies. Only cutting the first electrically conductive ribbon according to the first option (i) may be useful in that the resulting assembly can be rolled up at this stage, for example for storage, e.g. till the moment of integration in a photovoltaic module, such as in a continuous photovoltaic module manufacturing line with high throughput. At that moment the roll of electrically insulating tape with the plurality of individual bypass diodes attached thereto can be unrolled and the electrically insulating tape can be cut (e.g., as required), to (e.g., completely) separate the individual bypass diode assemblies or groups of bypass diode assemblies from each other before they are connected to a photovoltaic module.

In example embodiments wherein a plurality of openings and a plurality of through holes are made, positioning the semiconductor component in the through hole comprises positioning a semiconductor component in each of the plurality of through holes, placing the electrically conductive ribbon portion on the front side of the electrically insulating tape comprises placing a plurality of electrically conductive ribbon portions on the front side of the electrically insulating tape, each ribbon portion overlapping a semiconductor component, and forming electrical connections is performed sequentially for individual semiconductor components.

Aspects of the disclosure are set out in the accompanying independent and dependent claims. Features from the dependent claims may be combined with features of the independent claims and with features of other dependent claims as appropriate and not merely as explicitly set out in the claims.

BRIEF DESCRIPTION OF THE FIGURES

The above, as well as additional objects and features, of the present description, will be better understood through the following illustrative and non-limiting detailed description, with reference to the appended drawings. In the drawings like reference numerals will be used for like elements unless stated otherwise.

FIGS. 2A and 2B illustrate an example of a photovoltaic module comprising a plurality of photovoltaic cells and bypass diode assemblies integrated therewith, wherein FIG. 2A is a back side view the photovoltaic module and FIG. 2B is a cross section of part of the photovoltaic module at the location of a bypass diode assembly, along line B-B'.

Figure 1A:
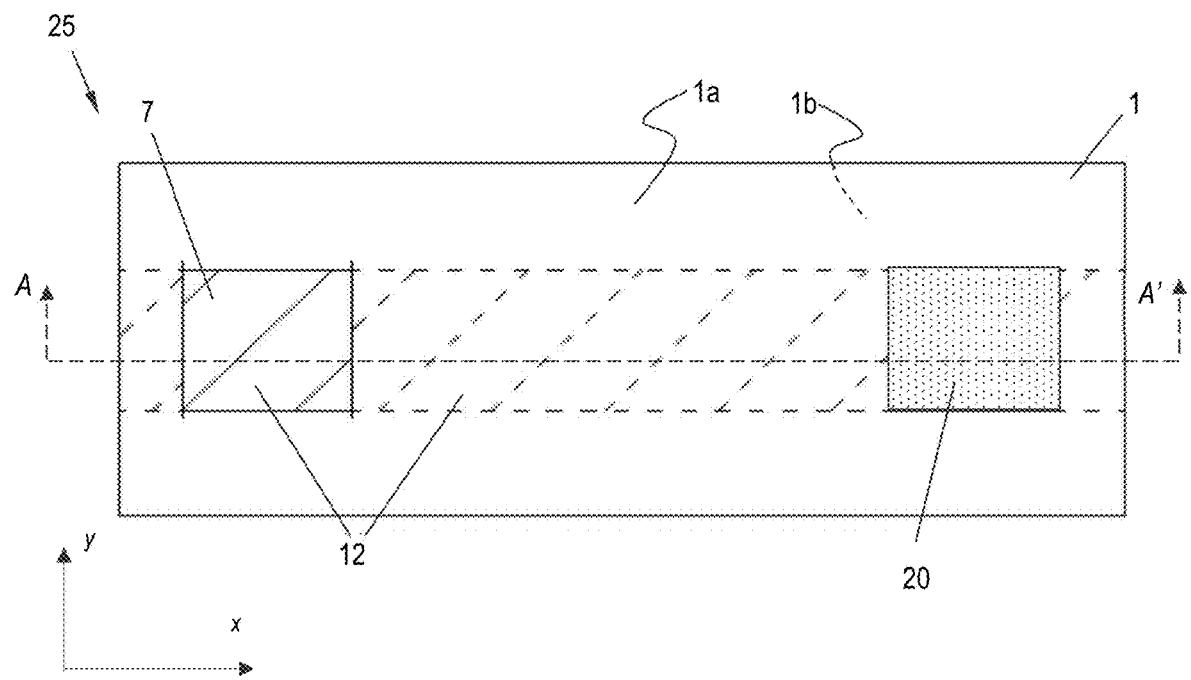
FIG. 1A schematically illustrates a top view and FIG. 1B illustrates a cross section along line A-A' of a bypass diode assembly according to an embodiment of the disclosure.

In the different figures, the same reference signs refer to the same or similar (e.g., analogous) elements.

All the figures are schematic, not necessarily to scale, and generally show parts which elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to example embodiments and with reference to certain drawings, but the disclosure is not limited thereto. The drawings described are schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. The terms so used are interchangeable under appropriate circumstances and that the embodiments of the disclosure described herein are capable of operation in other sequences than described or illustrated herein.

The term "comprising", used in the claims, should not be interpreted as being restricted to the list thereafter. It does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosure therefore also includes as one embodiment that no further components are present. Thus, the scope of the expression "a device comprising means A and B" should not be limited to devices consisting only of components A and B. It discloses that with respect to the present disclosure, the only relevant components of the device are A and B.

Reference throughout this specification to "one embodiment" or "an embodiment" discloses that an example feature, structure, or characteristic described in connection with the embodiment is included in at least one embodiment of the present disclosure. Thus, appearances of the phrases "in one embodiment" or "in an embodiment" in various places throughout this specification are not necessarily (e.g., all) referring to the same embodiment. Furthermore, the example features, structures or characteristics may be combined in any suitable manner in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure uses more features than are expressly recited in each claim. Rather, as the following claims reflect, aspects of the disclosure may lie in less than all features of a single foregoing disclosed embodiment. Thus, the claims herein are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments. For example, in the following claims, any of the claimed embodiments can be used in any combination.

In the description provided herein, numerous specific details are set forth. However, embodiments of the disclosure may be practiced without these specific details. In other instances, suitable methods, structures, and techniques have not been shown in detail in order not to obscure an understanding of this description.

Figure 1B:
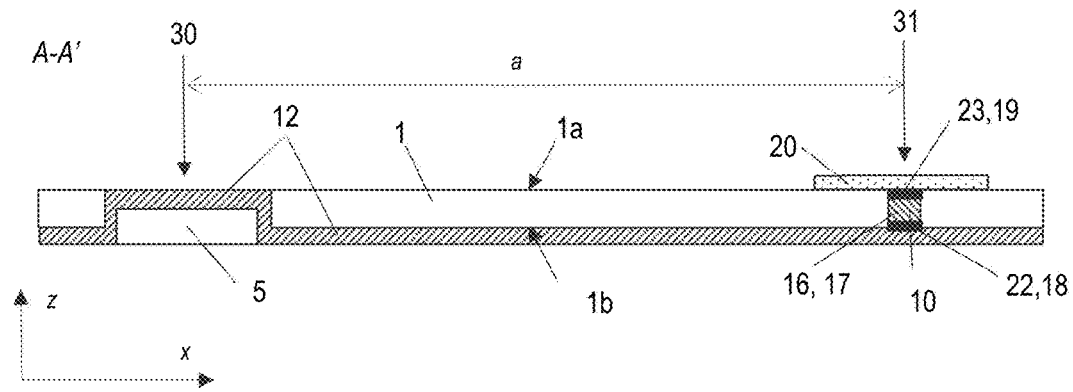

FIG. 1A schematically illustrates a top view and FIG. 1B illustrates a cross section along line A-A' of a bypass diode assembly 25 according to an embodiment of the disclosure. In the description and drawings provided herein, the top view of the bypass diode assembly is a view from a side of the bypass diode assembly (e.g., intended) for facing a photovoltaic module, which may be a back side of the photovoltaic module, when integrating it therewith.

The bypass diode assembly 25 comprises an electrically insulating tape 1 extending in a longitudinal direction x, wherein the electrically insulating tape 1 has a front side 1a and a back side 1b. In an example embodiment the width of the electrically insulating tape 1, being the dimension in a direction y orthogonal to the longitudinal direction x, is in the range between 10 mm and 100 mm. The electrically insulating tape 1 may be covered by, coated by, an adhesive layer at both opposite sides. As an example, the electrically conductive tape comprises an electrically insulating polymer layer for example a polyethylene terephthalate (PET) layer sandwiched between two outer adhesive layers. In an example embodiment, the outer layers (e.g., only) become adhesive, sticky, upon heating to a temperature above ambient temperature. Such tapes may be APA (Adhesive-PET-Adhesive) tapes. The thickness of the electrically insulating tape 1, being the dimension in a direction z orthogonal to the x-y plane, is for example in the range between 0.1 mm and 0.5 mm, or in the range between 0.2 mm and 0.4 mm, for example about 0.3 mm.

A first electrically conductive ribbon 12 oriented parallel to longitudinal direction x is attached to the electrically insulating tape 1 at its back side 1b. The first electrically conductive ribbon 12 extends over the back side 1b at least between a first location 30 and a second location 31 spaced apart by a predetermined distance a in the longitudinal direction x. The first electrically conductive ribbon 12 at least partially overlaps the first location 31 and the second location 30 and is locally exposed at the front side 1a through an opening 7 in the electrically insulation tape 1 at the first location 30. In the example illustrated in FIGS. 1A and 1B the first electrically conductive ribbon 12 (e.g., fully) overlaps the first location 30 and the second location 31, and it is exposed at the front side 1a of the electrically insulating tape 1 over the (e.g., entire) surface area of the opening 7. The dimensions of the openings 7 are selected to provide a (e.g., good, reliable) electrical contact to a photovoltaic cell and may depend on the width of the electrically insulating tape 1. In an example embodiment, the opening 7 has a surface area in the range between 20 mm×20 mm and 25 mm×25 mm, for example 22 mm×22 mm. The predetermined distance a between the first location 30 and the second location 31 is selected based on the number of photovoltaic cells to be bridged by the bypass diode assembly 25, and the dimensions of and the distance between the photovoltaic cells to which the bypass diode assembly 25 is to be electrically connected. In an exemplary embodiment, the predetermined distance a is in the range between 60 mm and 90 mm, such as about 75 mm.

The first electrically conductive ribbon 12 is for example a metal ribbon such as a copper ribbon or a multilayer structure comprising a metal layer such as a copper layer. The width of the first electrically conductive ribbon 12 is provided based on the dimensions of the openings 7. The thickness of the first electrically conductive ribbon 12 is provided taking into account the electrical characteristics, such as the electrical resistivity, of the ribbon material and the electrical currents to be conducted, to avoid undesired resistive losses. In an example embodiment, the width of the first electrically conductive ribbon is in the range between 18 mm and 23 mm, for example about 20 mm, and has a thickness in the range between 0.05 mm and 0.15 mm, such as about 0.08 mm.

The bypass diode assembly 25 comprises a semiconductor component 16 positioned in the through hole 10 through the electrically insulating tape 1 at the second location 31. The semiconductor component 16 comprises a diode 17 having a first diode terminal 22 and a second diode terminal 23, a first contact pad 18 in electrical contact with the first electrically conductive ribbon 12 and electrically connected to the first diode terminal 22, and a second contact pad 19 electrically connected to the second diode terminal 23. The bypass diode assembly 25 further comprises an electrically conductive ribbon portion 20 on the front side 1a of the electrically insulating tape 1, wherein the electrically conductive ribbon portion 20 overlaps the semiconductor component 16 and is electrically connected to the second contact pad 19, The electrically conductive ribbon portion 20 is electrically isolated from the first electrically conductive ribbon 12 by the electrically insulating tape 1.

In the exemplary embodiment illustrated in FIGS. 1A and 1B the opening 7 and the through hole 10 have a square shape in the x-y plane of the electrically insulating tape 1 with lateral sides oriented in longitudinal direction x and in direction y respectively, and the center is in line with the longitudinal centerline of the electrically insulating tape. However, the opening 7 and/or the through hole 10 can have a shape different from a square shape, for example a rectangular shape, a triangular shape, a polygon shape, a circular shape, elliptical shape, and the center may be located outside the longitudinal centerline of the electrically insulating tape. The lateral sides may be oriented differently, for example in a slanted direction with respect to the longitudinal direction x. The sidewalls of the through holes may be (e.g., slightly) slanted with respect to the plane of the electrically insulating foil. The dimensions of the through hole 10 are selected based on the lateral size of the semiconductor component 16 to be provided therein. The dimensions of the through hole 10 are (e.g., slightly) larger than the dimensions of the semiconductor components 16, to provide reliable positioning of the semiconductor component 16 therein. In an example embodiment, the through holes have lateral dimensions of about 4 mm, resulting in through holes having a surface area of 4 mm×4 mm.

FIGS. 1A and 1B illustrate an example embodiment wherein the bypass diode assembly 25 has a single opening 7 and a single through hole 10. However, in embodiments, the bypass diode assembly 25 can comprise more than one opening 7 at the first location 30, and/or it can comprise more than one through hole 10 at the second location 31.

In example embodiments the diode 17 is a bare diode component, such as a Schottky diode, having a first contact pad 18 at the first diode terminal 22 and a second contact pad 19 at the second diode terminal 23, as schematically illustrated in FIGS. 1A and 1B.

In an example embodiment, the in-plane dimensions of the semiconductor component 16 are about 3 mm×3 mm. The height, thickness, of the semiconductor component 16 is somewhat larger than the thickness of the electrically insulating tape 1, such that the semiconductor component 16 extends slightly, for example about 50 micrometers, above the front side, front surface, 1a of the electrically insulating tape 1. This is useful in that electrical connection of the second contact pad 19 with the electrically conductive ribbon portion may be more reliable.

In an example embodiment, the electrically conductive ribbon portion 20 has a rectangular shape, as schematically illustrated in FIGS. 1A and 1B, and dimensions are about 20 mm×20 mm. Other shapes and/or other dimensions can be used, provided that the shape and dimensions form a (e.g., good and reliable) electrical connection between the second contact pad 19 of the semiconductor component 16 and a back contact of a photovoltaic cell. In example embodiments the ribbon portion 20 and the first electrically conductive ribbon 12 comprise a same material and/or have a same thickness and/or a similar width.

In the example embodiment illustrated in FIGS. 1A and 1B, at the location of the opening 7 at least one portion 5 of the electrically insulating tape 1 covers the back side of the first electrically conductive ribbon 12. In an example embodiment, the at least one portion 5 is not (e.g., completely) detached from the electrically insulating tape 1 but still attached thereto, for example at edges of the opening 7. This is useful in that the at least one portion 5 can mechanically support the first electrically conductive tape or ribbon 12 at the location of the opening and push it towards the front side 1a and maintain it in a (e.g., desired) position. In some embodiments, the at least one portion 5 can cover the back side of the first electrically conductive tape or ribbon 12 over the entire area of the opening 7, or over a part of the area of the opening 7, or the at least one portion 5 can be absent.

Figure 2A:
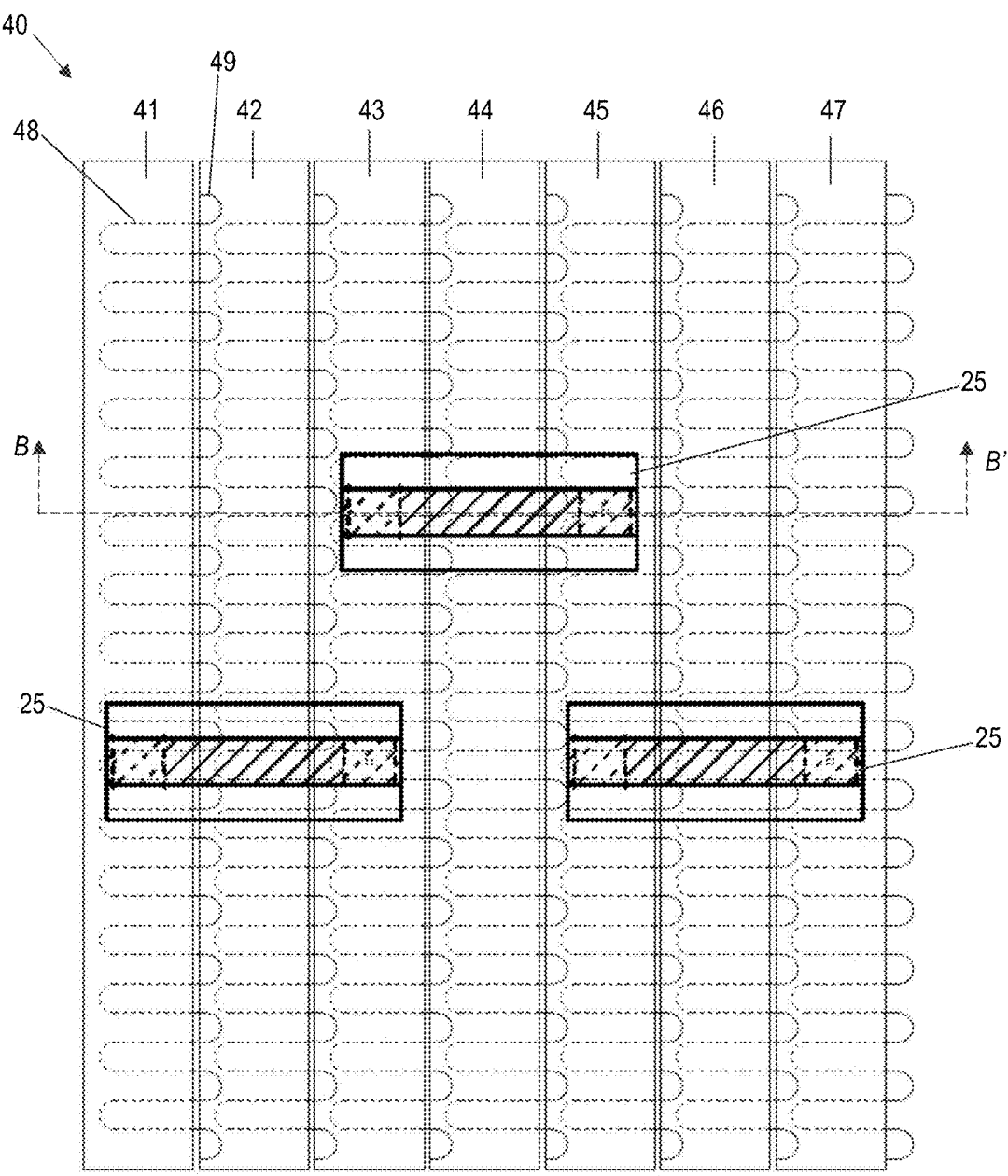
Figure 2B:
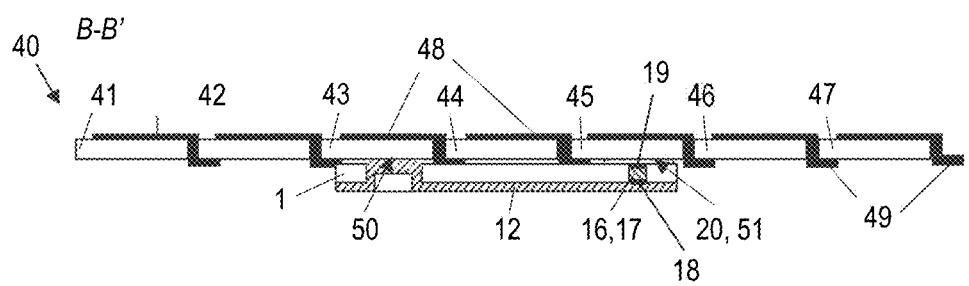

FIGS. 2A and 2B illustrate an example of a photovoltaic module 40 comprising a plurality of photovoltaic cells 41, 42, 43, 44, 45, 45, 46, 47 and bypass diode assemblies 25 integrated therewith. FIG. 2A is a back side view of the photovoltaic module 40, and FIG. 2B is a cross section of part of the photovoltaic module at the location of the uppermost bypass diode assembly 25, along line B-B'.

In FIGS. 2A and 2B, an example embodiment is shown wherein the plurality of photovoltaic cells 41 to 47 is electrically connected in series, and wherein three bypass diode assemblies 25 of the disclosure are included therewith at a back side of the photovoltaic module 40, each of the bypass diode assemblies 25 bridging three photovoltaic cells. This is an example, and more (or less) bypass diode assemblies 25 can be integrated, and/or the number of bridged photovoltaic cells may be different from three.

FIGS. 2A and 2B illustrate a first bypass diode assembly 25 (shown in FIG. 2A) bridging the series-connected photovoltaic cells 41, 42 and 43 and being electrically connected thereto in parallel, a second bypass diode assembly 25 (shown in FIG. 2A) bridging the series-connected photovoltaic cells 43, 44 and 45 and being electrically connected thereto in parallel, and a third bypass diode assembly 25 (shown in FIG. 2A) bridging the series-connected photovoltaic cells 45, 46 and 47 and being electrically connected thereto in parallel.

FIGS. 2A and 2B illustrate an example embodiment wherein the photovoltaic cells 41 to 47 are electrically connected in series by a first part 48 and a second part 49, such as serpentine-shaped wires. However, other wire shapes or other, non-wire-based, electrical connection methods can be used. FIGS. 2A and 2B show an example embodiment wherein the photovoltaic module 40 comprises thin-film photovoltaic cells. However, the disclosure is not limited thereto and also applies to other types of photovoltaic cells, for example silicon based photovoltaic cells. The photovoltaic module 40 shown in FIGS. 2A and 2B comprise a plurality of series connected photovoltaic cells 41 to 47, wherein each photovoltaic cell is shaped as an elongated strip. For example, each of the photovoltaic cells may comprise (e.g., a stack of) a metal carrier such as a stainless steel or aluminum foil, and an active photovoltaic layer stack such as a CIGS (copper indium gallium selenide) based layer stack. For each of the photovoltaic cells, a first part 48 of a wire is electrically connected to the front side of the photovoltaic cell, whereas a second part 49 of the wire extends laterally beyond an edge of the photovoltaic cell. The second part 49 of the wire is electrically connected to the back side of a neighboring cell, to thereby form an electrical series connection between both photovoltaic cells. In between two neighboring cells, the wire bends and passes from the front side of the photovoltaic module 40 to the back side thereof. The photovoltaic module 40 may further comprise a protective layer at the front side and at the back side, with an encapsulant material between the protective layers and the photovoltaic cells, for example laminated to the photovoltaic cells. Within the photovoltaic module 40, the bypass diode assemblies 25 are provided in between the back side of the photovoltaic cells 41 to 47 and the encapsulant and back sheet.

A photovoltaic module 40 according to the present disclosure can have a shape different from a rectangular shape. The photovoltaic module 40 shape and dimensions may depend on the shape and dimensions of the cells, the materials used, or the targeted application. The photovoltaic module 40 can be rigid or flexible and can be based on any suitable photovoltaic material.

The cross-section shown in FIG. 2B illustrates that the part of the first electrically conductive ribbon 12 that is exposed at the front side 1a of the electrically insulating tape 1 at the first location 30 forms a first contact area 50 configured for electrical connection to a back contact of a first photovoltaic cell 43, while the electrically conductive ribbon portion 20 at the second location 31 forms a second contact area 51 configured for electrical connection to a back contact of a second photovoltaic cell 45 that is electrically connected in series with the first photovoltaic cell 43. The first contact pad 18 of the semiconductor component 16 and thus the first diode terminal 22 is electrically connected to the first electrically conductive ribbon 12 and thereby to a back contact of the first photovoltaic cell 43 at the first contact area 50. The second contact pad 19 of the semiconductor component 16 and thus the second diode terminal 23 is electrically connected to the electrically conductive ribbon portion 20 and thereby to a back contact of the second photovoltaic cell 45 at the second contact area 51. In this way, the diode 17 of the bypass diode assembly 25 is electrically connected in parallel to the series-connected photovoltaic cells 43, 44, 45.

Figure 12:
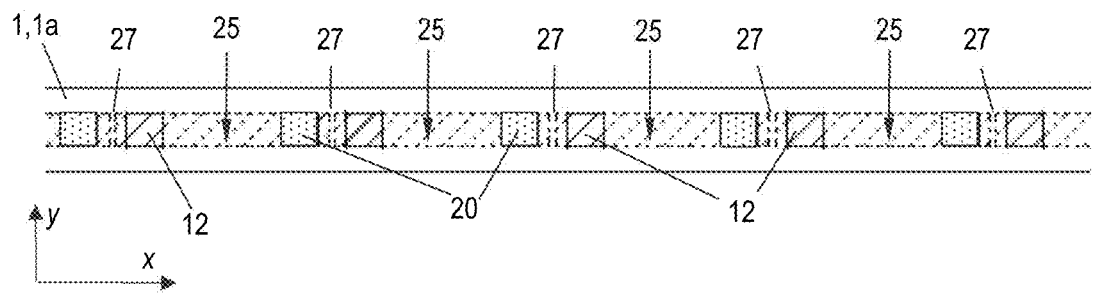
FIG. 12 illustrates forming a plurality of bypass diode assemblies by cutting only the first electrically conductive ribbon according to an embodiment of the disclosure.
Figure 13:
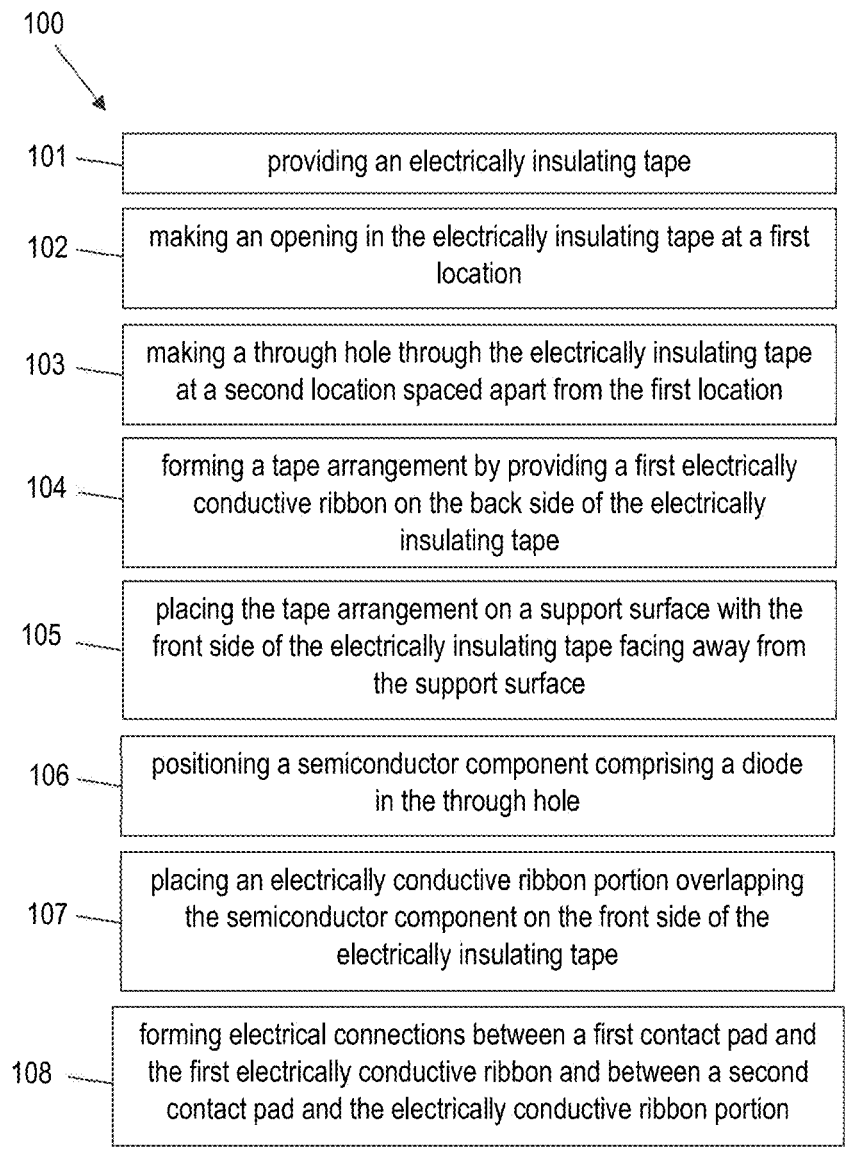
FIG. 13 is a schematic flow chart of a method for fabricating a bypass diode assembly according to an embodiment of the disclosure.

FIGS. 3, 4, 5A, 5B, 6A, 6B, 7A, 7B, 8A, 8B, 9A, 9B, 10, 11, and 12 illustrate steps of an example method 100 for fabricating a bypass diode assembly 25 of the present disclosure. A corresponding flow chart is schematically shown in FIG. 13.

Figure 3:
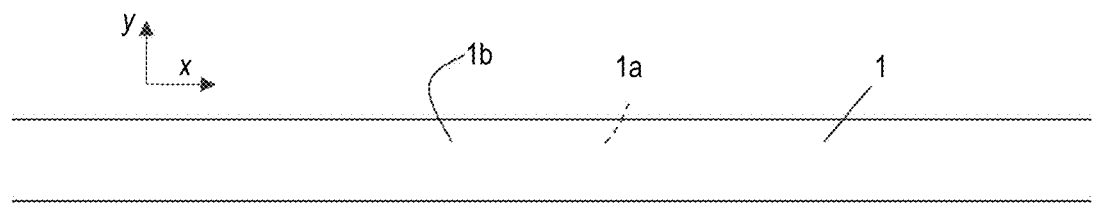
FIG. 3 shows an example of an electrically insulating tape that can be used in a method for fabricating a bypass diode assembly according to the disclosure.

A method 100 for fabricating a bypass diode assembly 25 of the present disclosure comprises providing 101 an electrically insulating tape 1. FIG. 3 shows an example of an electrically insulating tape 1 that can be used in a method for fabricating a bypass diode assembly according to the disclosure. The electrically insulating tape 1 extends in a longitudinal direction x and has a front side 1a and a back side 1b. In FIG. 3 a back side view of the electrically insulating tape 1 is shown. At the stage of providing 101 the electrically insulating tape 1, which is typically flexible, it may be supported by a suitable flat and horizontal rigid support surface, from its front side 1*a*.

The length of the electrically insulating tape 1, being its dimension in the longitudinal direction x, can be selected in a (e.g., very broad) range, between the length of the bypass diode assembly to be fabricated and a length of several meters. For example, in example embodiments the electrically insulating tape 1 can be provided as a roll of electrically insulating material in a continuous manufacturing line and unrolled as used during fabrication of the bypass diode assembly. The width of the electrically insulating tape 1, being its dimension in a direction y orthogonal to the longitudinal direction x, is selected based on the intended dimensions of the bypass diode assemblies to be fabricated.

The method 100 for fabricating a bypass diode assembly 25 further comprises making 102 an opening 7 in the electrically insulating tape 1 at at least one first location 30 of the electrically insulating tape 1, and making 103 a through hole 10 through the electrically insulating tape 1 at at least one second location 31 spaced apart over a predetermined distance a from the at least one first location 30 along the longitudinal direction x.

In an example embodiment, making 102 the opening 7 comprises making incisions 2 in the electrically insulating tape 1, the incisions 2 comprising a first cut 3 oriented in a first direction and two further cuts 4 at ends of the first cut 3 and oriented in a second direction different from the first direction, so that the opening 7 can be created by folding away at least one portion 5 of the electrically insulating tape 1. Incisions 2 can for example be made using a knife cutter or any other suitable cutting tool.

Figure 4:
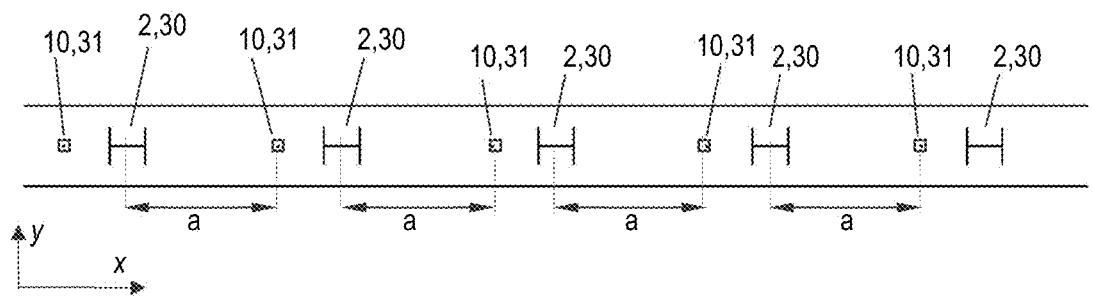
FIG. 4 illustrates an example of incisions made for forming first openings in an electrically insulating tape, and further illustrates through holes formed through the electrically insulating tape, alternating with the incisions along the longitudinal direction of the tape.
Figure 5A:
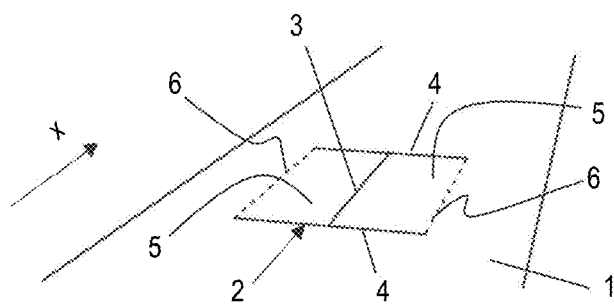
FIGS. 5A and 5B are schematic 3D views of incisions made in an electrically insulating tape, with portions of the tape remaining attached to the tape, and of an opening formed through the electrically insulating tape after folding away portions of the tape at the location of the incisions.
Figure 5B:
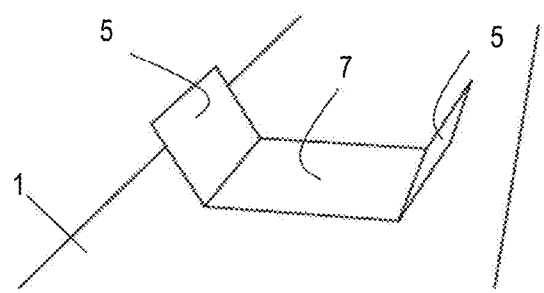

FIG. 4 illustrates an example embodiment of incisions 2 made for forming first openings 7 at a plurality of first locations, wherein each of the incisions 2 comprises a first cut 3 oriented in the longitudinal direction x and two further cuts 4 oriented in direction y orthogonal thereto. FIGS. 5A and 5B are schematic 3D views showing an example of such incisions 2 made in an electrically insulating tape 1 (shown in FIG. 5A), and creation of an opening 7 through the electrically insulating tape 1 by folding away portions 5 (shown in FIG. 5A) of the electrically insulating tape along folding lines 6. In the example shown, the portions 5 remain attached to the electrically insulating tape 1. In an example embodiment, for a 45 mm wide tape, each of the first cuts 3 and further cuts 4 have a length in the range between 20 mm and 25 mm, for example 22 mm, resulting in openings 7 having a surface area in the range between 20 mm×20 mm and 25 mm×25 mm, for example 22 mm×22 mm.

In another example embodiment, making 102 (shown in FIG. 13) the opening 7 comprises making at least two slits, which may be substantially parallel to each other and oriented in a direction substantially orthogonal to longitudinal direction x. The first electrically conductive ribbon 12 can (e.g., then) be inserted from the back side 1*b* of the electrically insulating tape 1 to the front side 1*a* through a first slit and from the front side 1*a* to the back side 2*b* through a second slit. A portion of the first electrically conductive ribbon 12 extending between the first slit and the second slit is then exposed at the front side 1*a* of the electrically insulating tape 1, while the remainder of the first electrically conductive ribbon 12 is supported from it back side by the electrically insulating tape 1 in an area between the first slit and the second slit, thereby keeping the first electrically conductive ribbon 12 (e.g., well) in place and pushing it towards the front side 1*a* of the electrically insulating tape 1.

FIG. 4 further illustrates an example of a plurality of through holes 10 made through the electrically insulating tape 1 at plurality of second locations 31. Through holes 10 can for example be made by punching. The dimensions of the through holes 10 may be (e.g., slightly) larger than the dimensions of the semiconductor components 16, to provide (e.g., reliable) positioning of the semiconductor components 16 therein.

Each of the second locations 31 is spaced apart by a predetermined distance a from a neighboring first location 30. First locations 30 are alternating with second locations 31, such that openings 7 are alternating with through holes 10 in the longitudinal direction x.

Figure 6A:
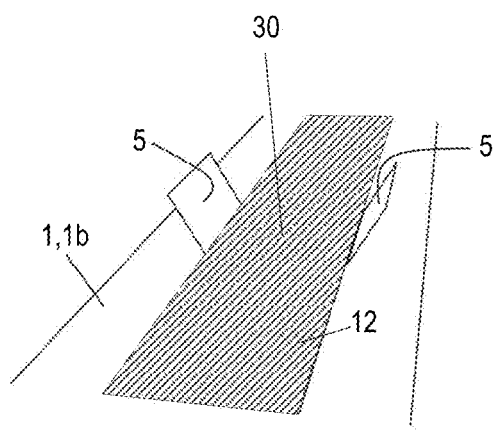
FIGS. 6A and 6B illustrate a first electrically conductive ribbon positioned on an electrically insulating tape, the first electrically conductive ribbon overlapping a first opening in the tape, before (FIG. 6A) and after (FIG. 6B) folding back portions of the electrically insulating tape onto the back side of the first electrically conductive ribbon.
Figure 6B:
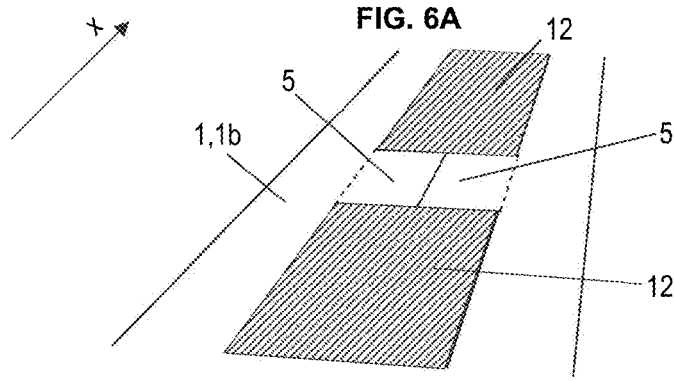
Figure 7A:
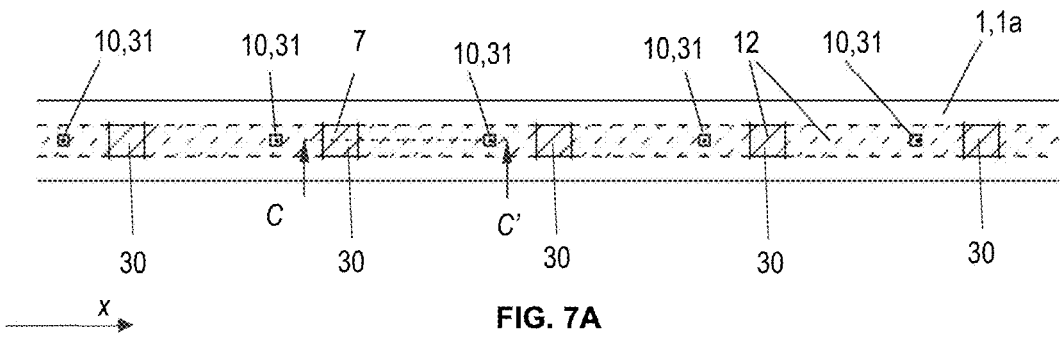
FIG. 7A schematically illustrates a top view and FIG. 7B schematically illustrates a partial cross section along line C-C' of a tape arrangement comprising an electrically insulating tape with a first electrically conductive ribbon positioned thereon, after folding back portions of the electrically insulating tape, and FIG. 7B further illustrates creation of an open cavity at the location of the through hole, with the bottom of the open cavity formed by the first electrically conductive ribbon.
Figure 7B:
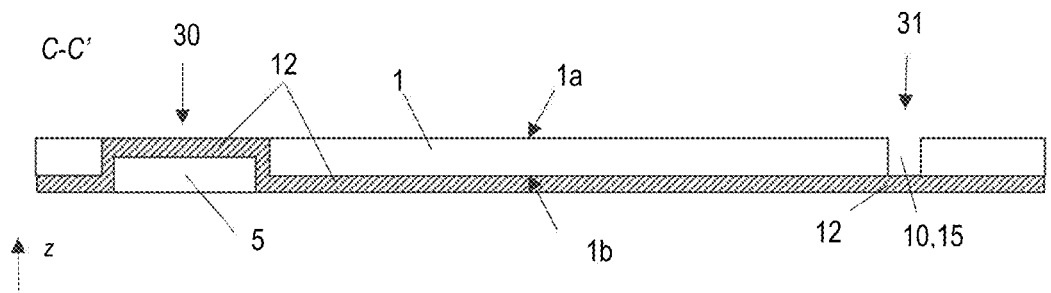

The method 100 for fabricating a bypass diode assembly 25 further comprises forming 104 a tape arrangement by providing a first electrically conductive ribbon 12 oriented parallel to the longitudinal direction x of the electrically insulating tape 1, on the on the back side 1*b* thereof. The step of forming 104 a tape arrangement is schematically illustrated in FIGS. 6A and 6B and FIGS. 7A and 7B. The first electrically conductive ribbon 12 is positioned on the electrically insulating tape 1 such that it extends at least between at a first location 30 and a second location 31 and at least partially overlaps the first location 30 and the second location 31. In the example embodiment illustrated in FIGS. 7A and 7B, a single first electrically conductive ribbon 12 extends over each of the first locations 30 and second locations 31 and fully overlaps each of the first locations 30 and second locations 31. At the location of the openings 7 the first electrically conductive ribbon 12 is thereby (e.g., locally) exposed at the front side 1*a* of the electrically insulating tape 1, as shown in FIG. 7B.

In example embodiments wherein forming the opening 7 comprises making incisions 2 in the electrically insulating tape 1 and folding away at least one portion 5 of the electrically insulating tape 1 wherein the at least one portion 5 remains attached to the electrically insulating tape 1, the first electrically conductive ribbon 12 is provided on the back side 1*b* of the electrically insulating tape 1 with the at least one portion 5 folded away. Afterwards the at least one portion 5 is folded back onto the back side of the at least one electrically conductive ribbon 12. FIGS. 6A and 6B illustrate positioning the first electrically conductive ribbon 12 on the electrically insulating tape 1 at the back side 1*b* thereof, before (shown in FIG. 6A) and after (shown in FIG. 6B) folding back portions 5 of the electrically insulating tape 1 onto the back side of the first electrically conductive ribbon 12. FIGS. 7A and 7B schematically show a top view, front side view, (shown in FIG. 7A) and a partial cross section along line C-C' (shown in FIG. 7B) of a tape arrangement comprising an electrically insulating tape 1 with a first electrically conductive ribbon 12 positioned on a back side 1*b* thereof, after the step of folding back portions 5 of the electrically insulating tape 1.

Next, the method 100 for fabricating a bypass diode assembly 25 comprises placing 105 the tape arrangement on a support surface (not shown in the drawings), with the back side 1*b* of the electrically insulating tape 1 oriented towards the support surface and the front side 1*a* of the electrically insulating tape 1 facing away from the support surface, such that the front side 1*ab* is accessible, exposed. This involves flipping, turning over, the tape arrangement. It results in the creation of an open cavity 15 at the location of the through hole 10, wherein at least part of a bottom of the open cavity 15 is formed by the first electrically conductive ribbon 12, in other words wherein the electrically conductive ribbon 12 is present at at least part of the bottom of the open cavity 15 and therefore accessible at the location of the through hole 10, for example for electrical connection. In exemplary embodiments wherein the first electrically conductive ribbon 12 fully overlaps the second location 31, the (e.g., entire) bottom of the open cavity 15 is formed by the first electrically conductive ribbon 12. This is illustrated in FIG. 7B.

Figure 8A:
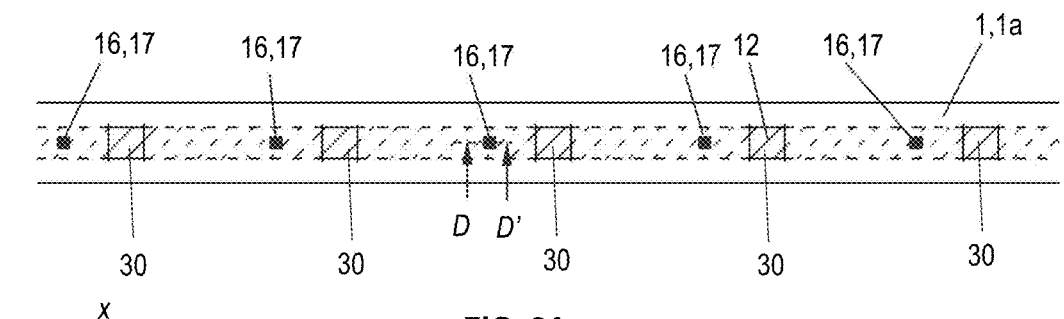
FIG. 8A schematically illustrates a top view and FIG. 8B schematically illustrates a partial cross section along line D-D' of a tape arrangement after positioning a semiconductor component in through holes through the electrically insulating tape.
Figure 8B:
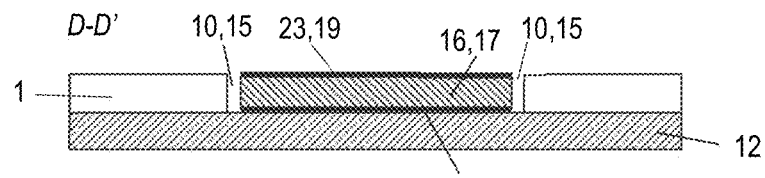

The method 100 for fabricating a bypass diode assembly 25 further comprises positioning 106 a semiconductor component 16 in the through hole 10, the semiconductor component comprising a diode 17 having a first diode terminal 22 and a second diode terminal 23, a first contact pad 18 electrically connected with the first diode terminal 22 and a second contact pad 19 electrically connected to the second diode terminal 23, wherein the first contact pad 18 is provided in (e.g., physical) contact with the first electrically conductive ribbon 12 at the bottom of the open cavity 15. FIG. 8A schematically illustrates a top view and FIG. 8B illustrates a partial cross section along line D-D' of a tape arrangement after positioning a semiconductor component 16 positioned in a through hole 10 through the electrically insulating tape 1. In an example embodiment, the size, such as the outer dimensions, of the semiconductor component 16 in the plane of the electrically insulating tape 1 is smaller than the surface area of the through hole 10, such that it fits within lateral boundaries of the through hole and such that it can easily be positioned in the open cavity 15 with the first contact pad 18 in (e.g., physical) contact with the first electrically conductive ribbon 12 at the bottom of the open cavity 15. Positioning the semiconductor component 16 in the through hole 10, and thus in the open cavity 15, can be done by pick-and-place equipment.

Figure 9A:
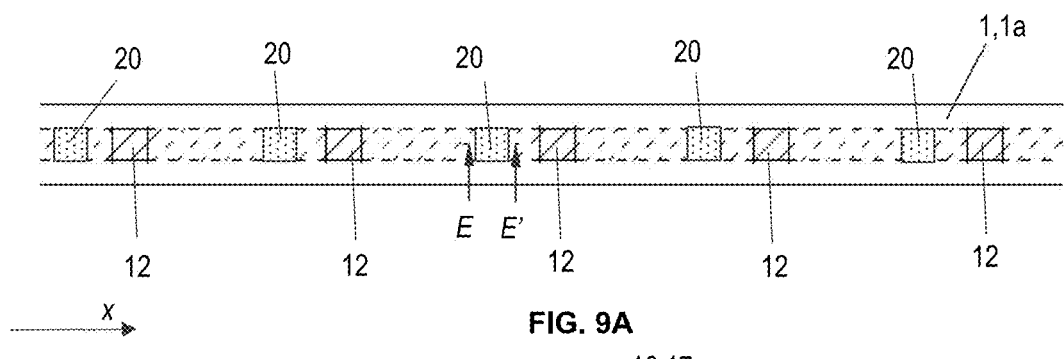
FIG. 9A schematically illustrates a top view of electrically conductive ribbon portions located opposite to a first electrically conductive ribbon at the location of a semiconductor component, and FIG. 9B schematically illustrates a partial cross section along line E-E'.
Figure 9B:
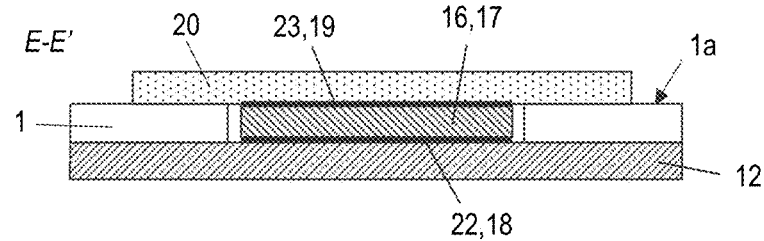

The method 100 for fabricating a bypass diode assembly 25 further comprises placing 107 an electrically conductive ribbon portion 20 on the front side 1a of the electrically insulating tape 1, the electrically conductive ribbon portion 20 overlapping the semiconductor component 16, wherein the electrically conductive ribbon portion 20 is in (e.g., physical) contact with the second contact pad 19 of the semiconductor component 16. The electrically conductive portion 20 is electrically isolated from the first electrically conductive ribbon 12 by the electrically insulating tape 1. This is schematically illustrated in FIGS. 9A and 9B, showing electrically conductive ribbon portions 20 located opposite to a first electrically conductive ribbon 12 at the location of a semiconductor component 16. FIG. 9A is a top view, and FIG. 9B is a partial cross section along line E-E'.

Figure 10:
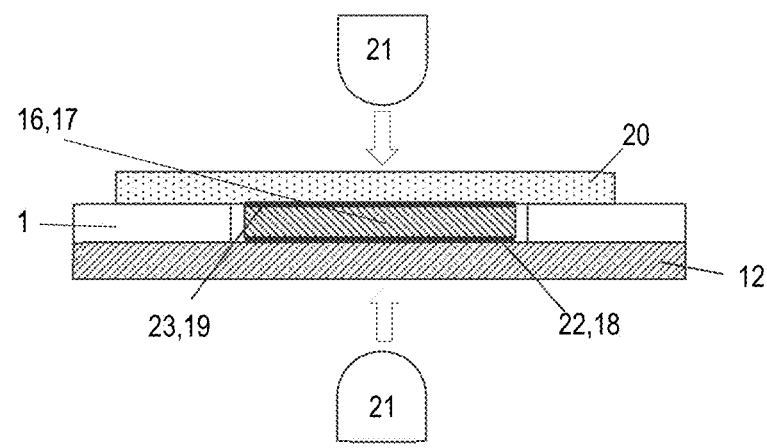
FIG. 10 schematically illustrates electrical connection of a first electrically conductive ribbon to a first contact pad and electrical connection of an electrically conductive ribbon portion to a second contact pad by point welding.

The method 100 for fabricating a bypass diode assembly 25 further comprises forming 108 an electrical connection between the first contact pad 18 and the first electrically conductive ribbon 12 and forming an electrical connection between the second contact pad 19 and the electrically conductive ribbon portion 20. As the first contact pad 18 is electrically connected to the first diode terminal 22 and the second contact pad 19 is electrically connected to the second diode terminal 23, the diode 17 is thereby electrically connected between the first electrically conductive ribbon 12 and the electrically conductive ribbon portion 20. Forming the electrical connections may be done by soldering or by welding. As an example thereof, FIG. 10 schematically illustrates electrical connection of a first electrically conductive ribbon 12 to a first contact pad 18 and electrical connection of an electrically conductive ribbon portion 20 to a second contact pad 19 by point welding or spot welding. The assembly can, for example, be fed through a spot-welding tool having two welding tips 21. The welding tips 21 are heated and brought into contact (as shown by the arrows in FIG. 10) with the first electrically conductive ribbon 12 and the electrically conductive ribbon portion 20 respectively at the location of the semiconductor component.

Other tools and methods may be used for forming these electrical connections, for example an ultrasonic welding method or a soldering method. Soldering involves providing a solder material in between the first contact pad 18 and the first electrically conductive ribbon 12 and between the second contact pad 19 and the electrically conductive ribbon portion 20. The solder material may be provided on the first contact pad 18 and/or on the second contact pad 19 before positioning the semiconductor component 16 in the through hole 10. Alternatively, the solder material can be provided after positioning the semiconductor component 16 in the through hole 10, by forming an opening in the first electrically conductive ribbon 12 at the location of the first contact pad 18 followed by bringing in solder material through the opening. This can be done before or after placing the electrically conductive ribbon portion 20 on the front side 1a of the electrically insulating tape 1. If it is done afterwards, solder material can be provided through an opening formed in the electrically conductive ribbon portion 20 at the location of the second contact pad 19.

In an example embodiment of the method 100 for fabricating a bypass diode assembly 25, the first electrically conductive ribbon 12 and/or the electrically conductive ribbon portion 20 are attached to the electrically insulating tape 1 by an adhesive force before forming the electrical connections. This is useful in that the first electrically conductive ribbon 12 and/or the electrically conductive ribbon 20 are maintained at their desired position within the tape arrangement, such that undesired movement or shifting during subsequent fabrication steps is minimized or (e.g., substantially) avoided. In example embodiments, wherein the electrically insulating tape 1 comprises outer adhesive layers, attaching by an adhesive force can be realized by heating the tape arrangement to a temperature at which the outer adhesive layers become sticky, optionally in combination with applying a pressure. Upon cooling down afterwards, the first electrically conductive ribbon 12 and/or the electrically conductive ribbon portion 20 are attached to the electrically insulating tape 1 by an adhesive force. In example embodiments, heating the tape arrangement comprises locally heating the first electrically conductive ribbon 12 and/or the electrically conductive ribbon portion 20 at predetermined locations, thereby locally attaching the first electrically conductive ribbon 12 and/or the electrically conductive ribbon portion 20 to the electrically insulating tape 1.

In an example embodiment of a method 100 for fabricating a bypass diode assembly 25, making an opening 7 in the electrically insulating tape 1 comprises making an opening 7 at a plurality of first locations 30 along the longitudinal direction of the electrically insulating tape 1, thereby obtaining a plurality of openings 7. The method may also include making a through hole 10 through the electrically insulating tape 1 which comprises making a through hole 10 at a plurality of second locations 31 spaced apart over a predetermined distance a from the at least one first location 30 along the longitudinal direction x, thereby obtaining a plurality of through holes 10, wherein second locations 31 are alternating with first locations 30 in the longitudinal direction x. The method further may include providing the first electrically conductive ribbon 12 which comprises providing a single electrically conductive ribbon 12 extending over each of the plurality of first locations 30 and each of the plurality of second locations 31, and cutting the first electrically conductive ribbon 12 and optionally cutting the electrically insulating tape 1 between each of the plurality of first locations 30 and one neighboring second location 31, to thereby obtain a plurality of bypass diode assemblies 25. In such embodiments, positioning the semiconductor component 16 in the through hole 10 may comprise positioning a semiconductor component 16 in each of the plurality of through holes 10, placing the electrically conductive ribbon portion 20 on the front side 1a of the electrically insulating tape 1 by placing a plurality of electrically conductive ribbon portions 20 on the front side 1a of the electrically insulating tape 1, each electrically conductive ribbon portion 20 overlapping a semiconductor component 16, and forming electrical connections can be performed sequentially for individual semiconductor components 16. Alternatively forming electrical connections can be performed for a plurality of semiconductor components 16 simultaneously. Such example embodiments are useful in that a plurality of bypass diode assemblies 25 can be fabricated using a single, continuous electrically insulating tape 1, that can for example be provided from a roll of electrically insulating tape material, for example in an in-line high-throughput fully automated manufacturing line. In such a manufacturing line subsequent steps of a method 100 for fabricating a bypass diode assembly 25 can be performed by suitably arranged mechanical handling systems for the electrically insulating tape 1, the first electrically ribbon 12, tape portions 5, the semiconductor devices 16, the electrically conductive ribbon portions 20 (e.g., etc.), and automated welding or soldering tools can be used, as well as cutting tools for separating the plurality of bypass diode assemblies 25 from each other to thereby obtain a plurality of bypass diode assemblies 25. Embodiments wherein only the first electrically conductive ribbon 12 is cut are useful in that the continuous electrically insulating tape 1 comprising the plurality of bypass diode assemblies 25 can be rolled up, for example for temporal storage and later use in a continuous photovoltaic manufacturing line. In such photovoltaic manufacturing line the electrically insulating tape 1 comprising the plurality of bypass diode assemblies 25 can then be rolled off again, and either individual bypass diode assemblies 25 or groups of bypass diode assemblies 25 can be cut from the unrolled part by cutting the electrically insulating tape 1 in between bypass diode assemblies 25 as used for integration with a photovoltaic string or a photovoltaic module being fabricated.

Figure 11:
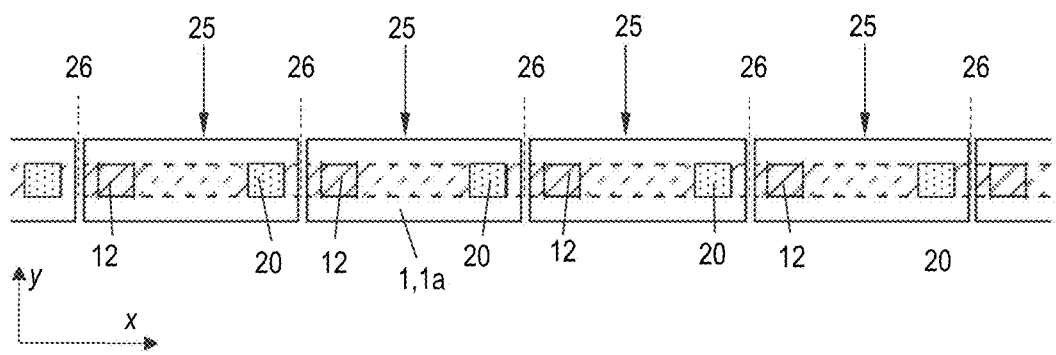
FIG. 11 illustrates forming a plurality of bypass diode assemblies by cutting the electrically insulating tape and the first electrically conductive ribbon according to an embodiment of the disclosure.

FIG. 11 illustrates forming a plurality of bypass diode assemblies by cutting the electrically insulating tape and the first electrically conductive a schematically indicated by dashed line 26. FIG. 12 illustrates forming a plurality of bypass diode assemblies by cutting only the first electrically conductive ribbon as schematically indicated by dashed line at locations 27.

When integrating a bypass diode assembly 25 of the present disclosure into a photovoltaic cell string or a photovoltaic module 40, the bypass diode assembly 25 or a plurality of bypass diode assemblies 25 is positioned on the rear side of a photovoltaic cell string with its front side facing the back side of the photovoltaic string. Thereby the opening 7 through which the first electrically conductive ribbon 12 is exposed at the front side 1a of the electrically insulating tape 1 is brought into (e.g., physical) contact with a back contact of a first photovoltaic cell of the cell string and the electrically conductive ribbon portion 20 is brought into (e.g., physical) contact with a back contact of a second photovoltaic cell of the cell string. Next an encapsulant layer and a back sheet covering the bypass diode assemblies 25 can be provided at the back side of the photovoltaic string or photovoltaic module. In an example embodiment, also an encapsulant layer and a front sheet covering the front side of the photovoltaic cell or photovoltaic module is provided. This is followed by a lamination process to thereby attach the back sheet to the back side of the photovoltaic string or photovoltaic module, with the bypass diode assemblies stacked between the photovoltaic string or photovoltaic module and the back sheet, and to thereby attach the front sheet to the front side of the photovoltaic module. The heating step performed during the lamination step results in the formation of an electrical connection between the first electrically conductive ribbon 12 and the back contact of the first photovoltaic cell, and thus between the first diode terminal 22 and the back contact of the first photovoltaic cell. The heating step performed during the lamination step further results in the formation of an electrical connection between the electrically conductive ribbon portion 20 and the back contact of the second first photovoltaic cell, and thus between the second diode terminal 23 and the back contact of the second photovoltaic cell. Thereby the diode 17 is electrically connected between the first photovoltaic cell and the second photovoltaic cell, such that it can function as a bypass diode.

The disclosure herein has mainly been described with reference to a number of non-limiting examples. However, other examples than the ones disclosed above are possible within the scope of the inventive concept, as disclosed in the claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A bypass diode assembly for a photovoltaic module, the bypass diode assembly comprising:
   an electrically insulating tape extending in a longitudinal direction, the electrically insulating tape having a front side and a back side;
   a first electrically conductive ribbon attached to the electrically insulating tape and oriented parallel to the longitudinal direction, wherein the first electrically conductive ribbon extends over the back side of the electrically insulating tape at least between a first location and a second location spaced apart over a predetermined distance in the longitudinal direction and at least partially overlaps the first location and the second location, and wherein the first electrically conductive ribbon is locally exposed at the front side through an opening in the electrically insulation tape at the first location, wherein:
   the bypass diode assembly comprises a semiconductor component positioned in a through hole through the electrically insulating tape at the second location, wherein the semiconductor component comprises:

a diode having a first diode terminal and a second diode terminal, a first contact pad in electrical contact with the first electrically conductive ribbon and electrically connected to the first diode terminal, and a second contact pad electrically connected the second diode terminal, the bypass diode assembly further comprises an electrically conductive ribbon portion on the front side of the electrically insulating tape and overlapping the semiconductor component, wherein the electrically conductive ribbon portion is in electrical contact with the second contact pad of the semiconductor component and wherein the electrically conductive ribbon portion is electrically isolated from the first electrically conductive ribbon by the electrically insulating tape.

2. The bypass diode assembly according to claim 1, wherein the semiconductor component is a bare die Schottky diode component.

3. The bypass diode assembly according to claim 1, wherein the first electrically conductive ribbon and the electrically conductive ribbon portion are attached to the electrically insulating tape by an adhesive.

4. The bypass diode assembly according to claim 1, wherein the electrically insulating tape is an adhesive-PET-adhesive tape, comprising a polyethylene terephthalate layer sandwiched between two adhesive layers.

5. The bypass diode assembly according to claim 1, wherein a thickness of the electrically insulating tape is between 0.2 mm and 0.4 mm.

6. The bypass diode assembly according to claim 1, wherein a thickness of the first electrically conductive ribbon and of the electrically conductive ribbon portion is between 0.05 mm and 0.15 mm.

7. The bypass diode assembly according to claim 1, wherein the first contact pad is electrically connected to the first electrically conductive ribbon by a welded or soldered connection and wherein the second contact pad is electrically connected to the electrically conductive ribbon portion by a welded or soldered connection.

8. The bypass diode assembly according claim 1, wherein the first electrically conductive ribbon fully overlaps the first location and is locally exposed at the front side over substantially the entire surface area of the opening.

9. The bypass diode assembly according to claim 1, wherein at the location of the opening at least one portion of the electrically insulating tape covers a back side of the first electrically conductive ribbon.

10. A photovoltaic module comprising a plurality of photovoltaic cells electrically connected in series and further comprising at least one bypass diode assembly, wherein the diode of the at least one bypass diode assembly is electrically connected in parallel to one or more of the plurality of photovoltaic cells, and wherein the at least one bypass diode assembly comprises:

an electrically insulating tape extending in a longitudinal direction, the electrically insulating tape having a front side and a back side;

a first electrically conductive ribbon attached to the electrically insulating tape and oriented parallel to the longitudinal direction, wherein the first electrically conductive ribbon extends over the back side of the electrically insulating tape at least between a first location and a second location spaced apart over a predetermined distance in the longitudinal direction and at least partially overlaps the first location and the second location, and wherein the first electrically conductive ribbon is locally exposed at the front side through an opening in the electrically insulation tape at the first location, wherein:

the bypass diode assembly comprises a semiconductor component positioned in a through hole through the electrically insulating tape at the second location, wherein the semiconductor component comprises:

a diode having a first diode terminal and a second diode terminal, a first contact pad in electrical contact with the first electrically conductive ribbon and electrically connected to the first diode terminal, and a second contact pad electrically connected the second diode terminal, the bypass diode assembly further comprises an electrically conductive ribbon portion on the front side of the electrically insulating tape and overlapping the semiconductor component, wherein the electrically conductive ribbon portion is in electrical contact with the second contact pad of the semiconductor component and wherein the electrically conductive ribbon portion is electrically isolated from the first electrically conductive ribbon by the electrically insulating tape.

11. A method for fabricating a bypass diode assembly, the method comprises:

providing an electrically insulating tape extending in a longitudinal direction and having a front side and a back side;

making an opening in the electrically insulating tape at at least one first location of the electrically insulating tape;

making a through hole through the electrically insulating tape at at least one second location spaced apart over a predetermined distance from the at least one first location along the longitudinal direction;

afterwards forming a tape arrangement by providing a first electrically conductive ribbon oriented parallel to the longitudinal direction of the electrically insulating tape, on the back side thereof, the first electrically conductive ribbon extending at least between a first location and a second location and at least partially overlapping the first location and the second location, the first electrically conductive ribbon being locally exposed at the front side through the opening at the first location;

placing the tape arrangement on a support surface, with the front side of the electrically insulating tape facing away from the support surface, so that an open cavity is created at the location of the through hole, wherein at least part of a bottom of the open cavity is formed by the first electrically conductive ribbon;

positioning a semiconductor component in the through hole, the semiconductor component comprising a diode having a first diode terminal and a second diode terminal, a first contact pad electrically connected to the first diode terminal and a second contact pad electrically connected to the second diode terminal, wherein the first contact pad is provided in physical contact with the first electrically conductive ribbon at the bottom of the open cavity;

placing an electrically conductive ribbon portion on the front side of the electrically insulating tape, wherein the electrically conductive ribbon portion overlaps the semiconductor component, wherein the electrically conductive ribbon portion is in physical contact with the second contact pad of the semiconductor component, and wherein the electrically conductive ribbon portion is electrically isolated from the first electrically conductive ribbon by the electrically insulating tape; and forming an electrical connection between the first contact pad and the first electrically conductive ribbon and forming an electrical connection between the second contact pad and the electrically conductive ribbon portion by soldering or welding.

12. The method for fabricating a bypass diode assembly according to claim 11, wherein the first electrically conductive ribbon or the electrically conductive ribbon portion are attached to the electrically insulating tape by an adhesive force before forming the electrical connections.

13. The method for fabricating a bypass diode assembly according to claim 11, wherein making the opening comprises making incisions in the electrically insulating tape, the incisions comprising a first cut oriented in a first direction and two further cuts at ends of the first cut and oriented in a second direction different from the first direction, such that the opening can be created by folding away at least one portion of the electrically insulating tape.

14. The method for fabricating a bypass diode assembly according to claim 13, wherein the first cut is oriented substantially in the longitudinal direction of the electrically insulating tape and wherein the two further cuts are oriented in a direction substantially perpendicular thereto.

15. The method for fabricating a bypass diode assembly according to claim 11,
making an opening in the electrically insulating tape comprises making an opening at a plurality of first locations along the longitudinal direction of the electrically insulating tape, thereby obtaining a plurality of openings;
making a through hole through the electrically insulating tape comprises making a through hole at a plurality of second locations spaced apart over a predetermined distance from the at least one first location along the longitudinal direction, thereby obtaining a plurality of through holes,
wherein second locations are alternating with first locations in the longitudinal direction; and
providing the first electrically conductive ribbon comprises providing a single electrically conductive ribbon extending over each of the plurality of first locations and each of the plurality of second locations.

16. The method for fabricating a bypass diode assembly according to claim 14, wherein
positioning the semiconductor component in the through hole comprises positioning a semiconductor component in each of the plurality of through holes.

17. The method for fabricating a bypass diode assembly according to claim 13, further comprising, after providing the first electrically conductive ribbon on the back side of the electrically insulating tape, folding back the at least one portion onto a back side of the first electrically conductive ribbon.

18. The method for fabricating a bypass diode assembly according to claim 15, further comprising cutting the first electrically conductive ribbon and optionally cutting the electrically insulating tape between each of the plurality of first locations and one neighboring second location, to thereby obtain a plurality of bypass diode assemblies.

19. The method for fabricating a bypass diode assembly according to claim 16, further comprising placing the electrically conductive ribbon portion on the front side of the electrically insulating tape comprises placing a plurality of electrically conductive ribbon portions on the front side of the electrically insulating tape, each electrically conductive ribbon portion overlapping a semiconductor component.

20. The method for fabricating a bypass diode assembly according to claim 16, further comprising forming electrical connections is performed sequentially for individual semiconductor components.

* * * * *